United States Patent
Pan et al.

(10) Patent No.: US 6,716,744 B2
(45) Date of Patent: Apr. 6, 2004

(54) ULTRA THIN TUNGSTEN METAL FILMS USED AS ADHESION PROMOTER BETWEEN BARRIER METALS AND COPPER

(75) Inventors: Wei Pan, Vancouver, WA (US); David R. Evans, Beaverton, OR (US); Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 10/140,460

(22) Filed: May 6, 2002

(65) Prior Publication Data

US 2003/0207550 A1 Nov. 6, 2003

(51) Int. Cl.[7] .......................................... H01L 21/4763
(52) U.S. Cl. ...................... 438/628; 438/687; 438/584; 438/644

(56) References Cited

U.S. PATENT DOCUMENTS

| | | | |
|---|---|---|---|
| 5,744,192 A | | 4/1998 | Nguyen et al. |
| 6,268,289 B1 | * | 7/2001 | Chowdhury et al. ......... 438/687 |
| 6,326,297 B1 | * | 12/2001 | Vijayendran ................ 438/627 |
| 6,348,731 B1 | * | 2/2002 | Ashley et al. ............... 257/751 |
| 6,368,954 B1 | * | 4/2002 | Lopatin et al. ............. 438/627 |
| 6,413,858 B1 | * | 7/2002 | Chopra ........................ 438/643 |
| 6,486,063 B2 | * | 11/2002 | Yamasaki et al. ........... 438/687 |

OTHER PUBLICATIONS

Nuesca et al., *Surface effects in the MOCVD of copper*, Mat. Res. Soc. Symp. Proc. vol. 337, 1994, pp177–188.

* cited by examiner

*Primary Examiner*—Son L. Mai
*Assistant Examiner*—Thao P. Le
(74) *Attorney, Agent, or Firm*—David C. Ripma; Matthew D. Rabdau; Scott C. Krieger

(57) ABSTRACT

A method of adhering copper thin film to a substrate in an integrated circuit structure includes preparing a substrate, including forming active regions and trenches for interconnect structures; depositing a metal barrier layer on the substrate; depositing an ultra thin film layer of tungsten over the barrier metal layer; depositing a copper thin film on the tungsten ultra thin film layer; removing excess copper and tungsten to the level of the metal barrier layer; and completing the integrated circuit structure. An integrated circuit having a copper interconnect therein formed over a layer of barrier metal includes a substrate, including active regions, vias and trenches for interconnect structures; a metal barrier layer formed on the substrate, wherein said metal barrier layer is taken from the group of materials consisting of Ta, TiN, TaN, TaSiN and TiSiN, and formed to a thickness of between about 5 nm to 10 nm; an ultra thin film layer of tungsten formed on the barrier metal layer, said tungsten ultra thin film layer having a thickness of between about 1 nm to 5 nm; and a copper thin film layer formed on the tungsten ultra thin film layer to a thickness sufficient to fill the vias and trenches.

16 Claims, 2 Drawing Sheets

ULTRA THIN TUNGSTEN METAL FILMS USED AS ADHESION PROMOTER BETWEEN BARRIER METALS AND COPPER

RELATED APPLICATIONS

This application is related to Ser. No. 09/940,739, filed Aug. 27, 2001, for Thermal densification in the early stage of Copper MOCVD for depositing high quality Cu films with good adhesion and trench filling characteristics.

FIELD OF THE INVENTION

This invention relates to MOCVD of barrier and copper thin films for interconnects in semiconductor IC high-speed devices, and specifically to a method of enhancing adhesion properties of CVD copper.

BACKGROUND OF THE INVENTION

Copper films which are formed by metal organic chemical vapor deposition (MOCVD) on metal nitride barriers, such as TiN or TaN, for example, which are also formed by MOCVD, do not exhibit good adhesive integrity, especially when the copper layer is grown in situ on a nitride layer or structure. The exhibited adhesion properties have prevented the application of copper CVD technology in IC manufacturing.

A great deal of research has been done in this area in order to improve the adhesion of copper to underlying barrier films. The related application and the cited prior art identify some improvements which have been made in this field, and include water vapor injection, barrier surface oxidation, barrier surface pre-treatment, and thermal densification. Of these improvements, only thermal densification has been shown to have practical application in providing reasonable throughput when copper is to be deposited in narrow trenches and vias. However, as thermal densification requires additional steps, thermal densification in copper CVD is relatively complex, and has lower throughput compared to conventional CVD.

Atomic Layer CVD (ALD) is a relatively new technology that has been adopted in semiconductor research, and is now being adopted for commercial IC production. ALD uses rapidly operating valves to deliver individual reactants into a deposition chamber. Each reactant deposits a mono-layer of material on the IC surface through chemical absorption, and reacts with a previously deposited mono-layer species to form the desired compound. The as-formed compound has a much higher density than could ever be achieved by conventional CVD. The ALD process also provides excellent step coverage. By carefully selecting precursors, multi-layered, or alternating layered, barrier metal films are formed, e.g., alternating TaN/SiN, TaN/TiN and TiN/SiN thin films, or other combinations thereof, may be easily formed. An entire film stack formed by ALD may be only 50 Å thick, and also exhibits excellent barrier properties.

The application of ALD is particularly useful in the fabrication of a barrier layer, such as a multi-layered TaN/TiN thin film stack. TaN thin films exhibit better barrier properties than does a stack of TiN, but does not provide adequate adhesion for subsequent layers, particularly copper thin film layers. Single thin film layers also have a grain structure that allows some diffusion along the grain boundaries. Thus, a TaN/TiN multi-layer thin film stack is desirable, provided that copper can be made to adhere to such a thin film stack.

U.S. Pat. No. 5,744,192, for Method of using water vapor to increase the conductivity of copper deposited with Cu(Hfac) TMVS, to Nguyen et al, granted Apr. 28, 1998, describes the use of water vapor to enhance the adhesive properties of copper thin films.

Nuesca et al., *Surface effects in the MOCVD of copper*, Mat. Res. Soc. Symp. Proc. Vol. 337, 1994, pp 177–188, describes the use of hydrogen to enhance the adhesive properties of copper thin films.

SUMMARY OF THE INVENTION

A method of adhering copper thin film to a substrate in an integrated circuit structure includes preparing a substrate, including forming active regions and trenches for interconnect structures; depositing a metal barrier layer on the substrate; depositing an ultra thin film layer of tungsten over the barrier metal layer; depositing a copper thin film on the tungsten ultra thin film layer; removing excess copper and tungsten to the level of the metal barrier layer; and completing the integrated circuit structure.

An integrated circuit having a copper interconnect therein formed over a layer of barrier metal includes a substrate, including active regions and trenches for interconnect structures; a metal barrier layer formed on the substrate, wherein said metal barrier layer is taken from the group of materials consisting of Ta, TiN, TaN, TaSiN and TiSiN, and formed to a thickness of between about 5 nm to 10 nm; an ultra thin film layer of tungsten formed on the barrier metal layer, said tungsten ultra thin film layer having a thickness of between about 1 nm to 5 nm; and a copper thin film layer formed on the tungsten ultra thin film layer to a thickness required to fill the vias and trenches, which is usually a thickness of between about 10 nm to 20 nm.

It is an object of the invention is to increase the adhesive properties of copper thin films on metal and metal nitride substrates.

Another object of the invention is to provide a method of depositing tungsten on a metal or metal nitride substrate to enhance the adhesion of a copper thin film to the substrate.

This summary and objectives of the invention are provided to enable quick comprehension of the nature of the invention. A more thorough understanding of the invention may be obtained by reference to the following detailed description of the preferred embodiment of the invention in connection with the drawings.

DETAILED DESCRIPTION OF THE PREFERRED EMBODIMENT

In this invention, an ultra thin layer of tungsten, of between about 1 nm to 5 nm thick, is formed on any conventional barrier layers. Copper is then deposited by CVD. The adhesion between as-deposited tungsten and copper has been demonstrated to be excellent. In this way, barrier films, thin tungsten films, and copper films may be deposited in a smooth streamline CVD process with excellent adhesive integrity, and without the requirement of additional steps which result in a more complex fabrication process.

The ultra thin tungsten film, may be deposited by metal organic chemical vapor deposition (MOCVD) or atomic layer deposition (ALD), and acts as an adhesion promoter between the copper thin film and the metal barrier layers. Compared with other adhesion enhancing methods, the method of the invention provides a simple, easy, and straightforward way to fabricate copper interconnects in high-speed IC devices, and to provide adequate filling of vias and trenches with copper having adequate adhesive properties to the underlying IC structures.

Figure 1:
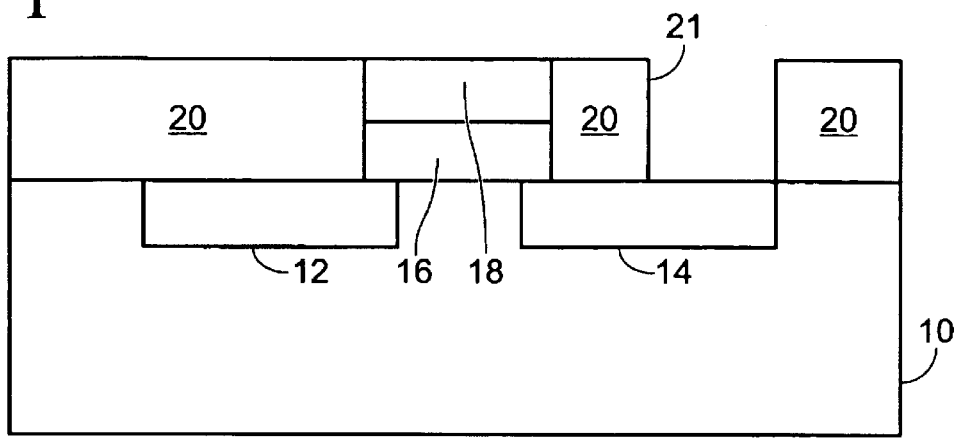
FIGS. 1 to 5 depict steps in the method of the invention and fabrication of a copper thin film integrated circuit device according to the invention.

Practice of the method of the invention begins with preparation of a substrate, and now referring to FIG. 1, shown generally at 10. The substrate is prepared by formation of active regions therein, such as source 12, drain 14, gate 16, and may include a gate stack 18. The substrate and structures thereon are covered with oxide 20, and the substrate and structures are patterned, and interconnect trenches, such as trench 21, formed therein. Patterning and trenching any be performed by any of the methods which are well know to those of skill in the art.

Figure 2:
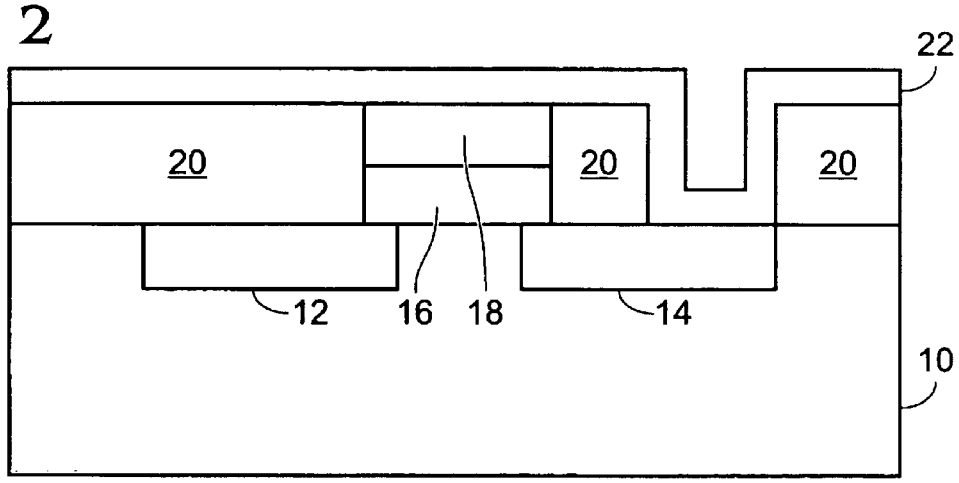

Referring now to FIG. 2, a layer of metal or metal nitride barrier film 22 is deposited on to the substrate and follows any patterning or trenching structures. By way of example, the barrier metal may be taken from the group of materials comprising Ta, TiN, TaN, TiSiN, and the metal may be deposited by physical vapor deposition (PVD) or MOCVD to a thickness of between about 5 nm to 10 nm.

Figure 3:
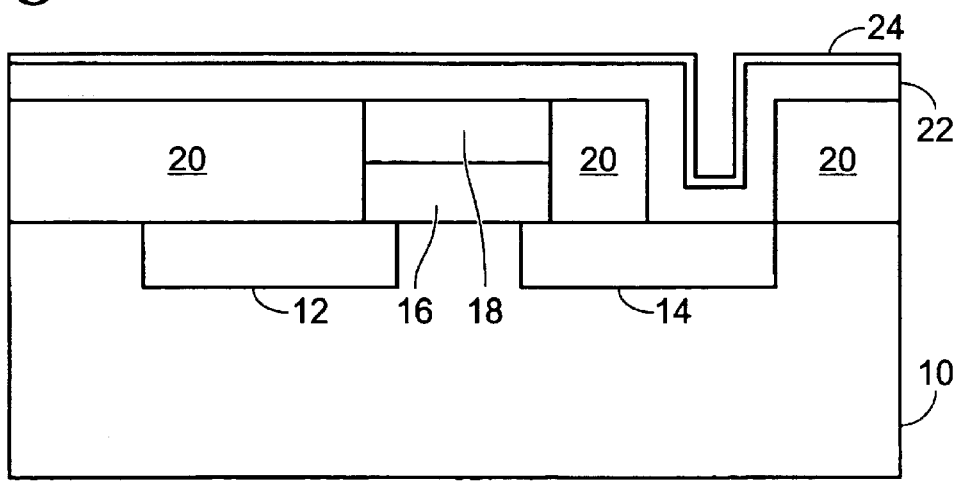

As shown in FIG. 3, a tungsten thin film 24, actually, an ultra thin film, is deposited either in situ or ex situ on the barrier metal thin films by MOCVD, using either $WF_6$ or $W(CO)_6$ as a precursor, to a thickness of between about 1 nm to 5 nm. The precursor is either gaseous $WF_6$, or a solid substance, such as $W(CO)_6$. The precursor is fed into, or transported by a carrier gas into, a CVD chamber at a temperature of between about 350° C. to 450° C., and the deposition takes between about one minute to two minutes to establish the tungsten ultra thin film of the desired thickness.

Figure 4:
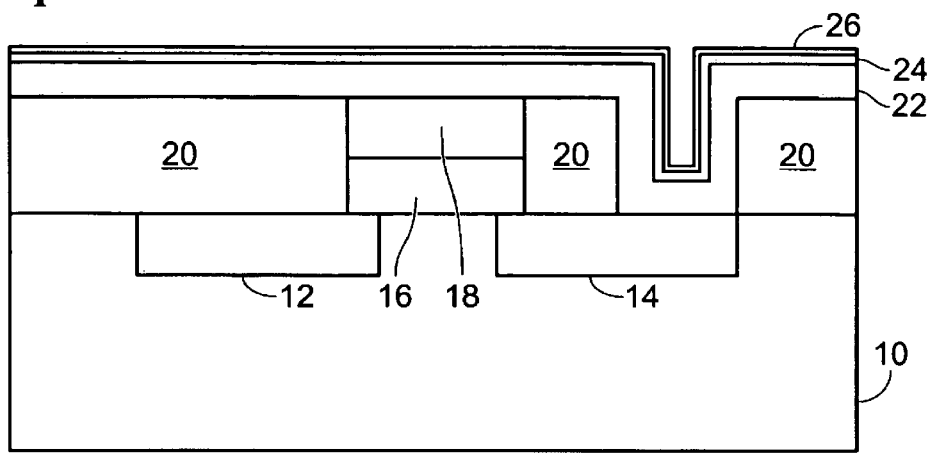

Turning now to FIG. 4, a copper thin film 26 is deposited onto the tungsten thin film by MOCVD to a thickness of between about 10 nm to 20 nm. Copper may be deposited by use of CupraSelect™ Blend precursor, as provided by Schumacher, introduced into the CVD chamber at a temperature of between about 180° C. to 250° C., and the deposition takes between about twelve seconds to ten minutes to establish the copper thin film of the desires thickness.

Figure 5:
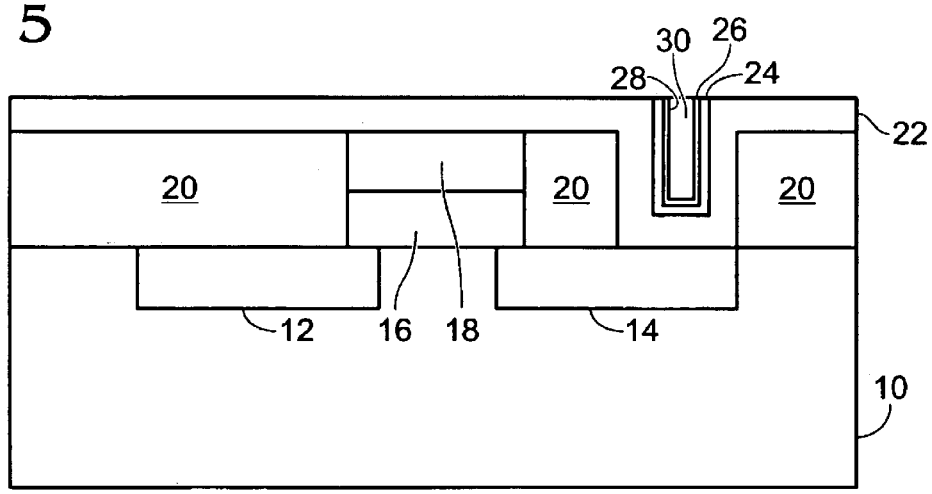

The structure is then ready for further copper electrical plating or chemical mechanical polishing (CMP), in the case of a CVD fill-up, to the level of the barrier film, as shown in FIG. 5. Additional IC structures and metallization may then be added to complete the copper thin film IC device, such as the filling of trench 28 by copper 30, by CVD or some other deposition technique.

The barrier metal, tungsten and copper may all be deposited by ALD, or any of the layers may be deposited by ALD and the remaining layers formed by CVD or MOCVD. As feature size decreases, particularly below 100 nm, it is advantageous to use ALD. A particularly good protocol is to form the barrier layer of TiN by ALD, ALD the tungsten layer, and deposit the copper by CVD.

Thus, a method for using ultra thin tungsten metal films as an adhesion promoter between CVD TiSiN, TaN, TaSiN and Cu has been disclosed. It will be appreciated that further variations and modifications thereof may be made within the scope of the invention as defined in the appended claims.

We claim:

1. A method of adhering copper thin film to a substrate in an integrated circuit structure comprising:
    preparing a substrate, including forming active regions, vias and trenches for interconnect structures;
    depositing a metal barrier layer on the substrate including depositing a layer of material taken from the group of materials consisting of Ta, TiN, TaN and TiSiN;
    depositing an ultra thin film layer of tungsten over the barrier metal layer;
    depositing a copper thin film in a single deposition step on the tungsten ultra thin film layer;
    removing excess copper and tungsten to the level of the metal barrier layer, and
    completing the integrated circuit structure.

2. The method of claim 1 wherein said depositing an ultra thin film layer of tungsten includes depositing a tungsten layer having a thickness of between about 1 nm to 5 nm.

3. The method of claim 1 wherein said depositing an ultra thin film layer of tungsten includes depositing the tungsten by a deposition method taken from the group of methods consisting of MOCVD and ALD.

4. The method of claim 1 wherein said depositing an ultra thin film layer of tungsten includes depositing the tungsten from a precursor taken from the group of precursors consisting of $WE_6$ and $W(CO)_6$.

5. The method of claim 1 wherein said depositing a barrier metal layer includes depositing a layer of material to a thickness of between about 5 nm to 10 nm.

6. The method of claim 1 wherein said depositing a barrier metal layer includes depositing a layer of material by PVD, ALD or MOCVD.

7. The method of claim 1 wherein said depositing a copper thin film includes depositing a layer of copper to a thickness sufficient to fill vias and trenches in the structure.

8. The method of claim 7 wherein said depositing a copper thin film includes depositing a layer of copper to a thickness sufficient to fill vias and trenches in the structure includes depositing a layer of copper to a thickness of between about 10 nm to 20 nm.

9. The method of claim 1 wherein said depositing a copper thin film includes depositing a layer of copper by PVD, ALD or MOCVD.

10. A method of adhering copper thin film to a substrate in an integrated circuit structure comprising:
    preparing a substrate, including forming active regions, vias and trenches for interconnect structures;
    depositing a metal barrier layer on the substrate including depositing a layer at of material taken from the group of materials consisting of Ta, TIN, TaN and TiSiN;
    depositing an ultra thin film layer of tungsten over the barrier metal layer to a thickness of between about 1 nm to 5 nm from a precursor taken from the group of precursors consisting of $WE_6$ and $W(CO)_6$;
    depositing a copper thin film in a single deposition step on the tungsten ultra thin film layer;
    removing excess copper and tungsten to the level of the metal barrier layer; and
    completing the integrated circuit structure.

11. The method of claim 10 wherein said depositing an ultra thin film layer of tungsten includes depositing the tungsten by a deposition method taken from the group of methods consisting of MOCVD and ALD.

12. The method of claim 10 wherein said depositing a barrier metal layer includes depositing a layer of material to a thickness of between about 5 nm to 10 nm.

13. The method of claim 10 wherein said depositing a barrier metal layer includes depositing a layer of material by PVD, ALD or MOCVD.

14. The method of claim 10 wherein said depositing a copper thin film includes depositing a layer of copper to a thickness sufficient to fill vias and trenches in the structure.

15. The method of claim 14 wherein said depositing a copper thin film includes depositing a layer of copper to a thickness sufficient to fill vias and trenches in the structure includes depositing a layer of copper to a thickness of between about 10 nm to 20 nm.

16. The method of claim 10 wherein said depositing a copper thin film includes depositing a layer of copper by PVD, ALD or MOCVD.

* * * * *